United States Patent [19]

Delbruck et al.

[11] Patent Number: 5,376,813
[45] Date of Patent: Dec. 27, 1994

[54] ADAPTIVE PHOTORECEPTOR INCLUDING ADAPTIVE ELEMENT FOR LONG-TIME-CONSTANT CONTINUOUS ADAPTATION WITH LOW OFFSET AND INSENSITIVITY TO LIGHT

[75] Inventors: Tobias Delbruck; Carver A. Mead, both of Pasadena, Calif.

[73] Assignee: California Institute of Technology, Pasadena, Calif.

[21] Appl. No.: 70,513

[22] Filed: Jun. 2, 1993

[51] Int. Cl.$^5$ ...................... H01L 27/02; H01L 27/14
[52] U.S. Cl. .................... 257/288; 257/296; 257/368; 257/370; 257/532
[58] Field of Search ............ 257/288, 290, 296, 368, 257/369, 370, 379, 431, 532, 577

[56] References Cited

U.S. PATENT DOCUMENTS 5,194,926  3/1993  Hayden ............................ 257/565

*Primary Examiner*—Mark V. Prenty
*Attorney, Agent, or Firm*—D'Alessandro, Frazzini & Ritchie

[57] ABSTRACT

An adaptive photoreceptor semiconductor circuit for long-time-constant continuous learning having a low offset and insensitivity to light includes a photodiode in series with an MOS feedback transistor connected across a potential difference. An inverting amplifier comprises a first MOS amplifier transistor having its gate connected to a source of bias voltage potential in series with an cascode transistor having its gate connected to a source of cascode voltage potential and a second MOS amplifier transistor having its gate connected to the common connection between the photodiode and the MOS feedback transistor. An output node comprises the connection between the first MOS amplifier transistor and the cascode transistor. A light insensitive adaptive element has a driven node connected to the output node and an isolated node connected to the gate of the MOS feedback transistor. A capacitive voltage divider is connected between a first power supply rail, the adaptive element, and the output node.

40 Claims, 4 Drawing Sheets

ADAPTIVE PHOTORECEPTOR INCLUDING ADAPTIVE ELEMENT FOR LONG-TIME-CONSTANT CONTINUOUS ADAPTATION WITH LOW OFFSET AND INSENSITIVITY TO LIGHT

The present invention was made with support from the United States Government under Grant N00014-89-J-1675 awarded by the Department of the Navy. The United States Government has certain rights in the invention.

BACKGROUND OF THE INVENTION

1. Field of the Invention

The present invention relates to photoreceptor semiconductor circuits. More particularly, the present invention relates to adaptive photoreceptor semiconductor circuits for long-time-constant continuous adaptation having low offset and insensitivity to light, and to adaptive elements for employment therein.

2. The Prior Art

Semiconductor photoreceptor circuits are known in the art. The precursor for the present inventions is a logarithmic photoreceptor described in C. A. Mead, A Sensitive Electronic Photoreceptor, 1985 Chapel Hill Conference on VLSI, H. Fuchs Ed., Rockville: Computer Science Press, pp. 463–471, 1985, used in the early silicon retinas described in M. A. Mahowald and C. A. Mead, "Silicon Retina," in Analog VLSI and Neural Systems, by C. Mead, Reading: Addison-Wesley, pp. 257–278, 1989, and C. A. Mead and M. A. Mahowald, "A Silicon Model of Early Visual Processing," Neural Networks, vol. 1, pp. 91–97, 1998, and in the SeeHear chip disclosed in L. Nielson, M. Mahowald, C. A. Mead, "SeeHear," in Analog VLSI and Neural Systems, by C. Mead, Reading: Addison-Wesley, chapter 13, pp. 207–227, 1989. (adapted there from 1987 International Association for Pattern Recognition, 5th Scandinavian Conference on Image Analysis.) These receptors have at least three deficiencies including the poor matching between different receptors, the poor match between the low sensitivity of the receptor and the high gain required to sense the small contrasts present in real images, and a slow time-response that limits the dynamic range.

An adaptive receptor that had a large transistor count, lacked any speedup advantage of the active feedback, and used an inferior adaptive element is described in T. Delbrück and C. A. Mead, "An electronic photoreceptor sensitive to small changes in intensity," in Advances in Neural Information Processing Systems I, D. S. Touretzky, Ed., San Mateo: Morgan Kaufman, pp. 720–727, 1988.

In addition, an adaptive silicon retina for sensing time-derivatives of the image contrast, using feedback is described in T. Delbrück and C. A. Mead, (1991), Silicon adaptive photoreceptor array that computes temporal intensity derivatives, in T. S. Jay Jayedev (ed,) Proc. SPIE, Infrared Sensors: Detectors, Electronics, and Signal Processing., vol. 1541, pp 92–99. A silicon retina photoreceptor incorporating feedback is described in M. A. Mahowald, "Silicon Retina with Adaptive Photoreceptors," Proc. SPIE./SPSE Symposium on Electronic Science and Technology: from Neurons to Chips, vol. 1473, pp. 52–58, April 1991. At about the same time, Mann, J. Mann "Implementing Early Visual Processing in Analog VLSI: Light Adaptation," Proc. SPIE/SPSE Symposium on Electronic Science and Technology: from Neurons to Chips, vol. 1473, pp. 128–136, April 1991, developed several adaptive photoreceptor circuits that are flexible but use a large number of components and were never fully reduced to practice. All of these receptors also lack the advantage of active speedup and use inferior adaptive elements. None of the previous receptors were satisfactorily characterized, in the sense that the simple engineering metrics like usable dynamic range and sensitivity were not obtained.

Prior art photosensitive devices are known and used in commercial imager arrays but are not particularly pertinent to the present invention. Such detectors are designed to be sampled in time, rather than operate in continuous time, and many of these devices cannot be built in a standard CMOS process.

BRIEF DESCRIPTION OF THE INVENTION

According to a first aspect of the present invention, an adaptive photoreceptor semiconductor circuit for long-time-constant continuous learning is characterized by a low offset and high sensitivity to small changes in illumination over a wide range of light levels. The adaptive photoreceptor of the present invention includes a photodiode in series with an MOS feedback transistor connected across a potential difference. An inverting amplifier comprises a P-Channel MOS amplifier transistor having its gate connected to a source of bias voltage potential in series with an N-Channel MOS Cascode transistor having its gate connected to a source of cascode voltage potential and an N-Channel MOS amplifier transistor having its gate connected to the common connection between the photodiode and the MOS feedback transistor. An output node of the adaptive photoreceptor comprises the connection between the P-Channel MOS amplifier transistor and the N-Channel MOS Cascode transistor. A light insensitive adaptive element is connected between the output node and the gate of the MOS feedback transistor. A capacitive voltage divider is connected between a first power supply rail, the adaptive element, and the output node.

According to a second aspect of the present invention, an expansive adaptive element having a driven node and an isolated node is formed in an isolated well structure of one conductivity type disposed in a semiconductor body of the opposite conductivity type. Two spaced apart doped regions are disposed in the well structure and a gate is disposed over the two regions to form an MOS transistor. The gate and one source-drain region of the MOS transistor and a first plate of a capacitor form the isolated node. The other plate of the capacitor is connected to a fixed voltage potential such as ground. The other source-drain region of the transistor and the bulk of the well form the driven node of the adaptive element.

According to a third aspect of the present invention, a compressive adaptive element having a driven node and an isolated node is formed in an isolated well structure of one conductivity type disposed in a semiconductor body of the opposite conductivity type. A biCMOS process is employed and the well structure forms the collector of a vertical bipolar transistor. A base region of conductivity type opposite to that of the well is formed in the well and an emitter region of a conductivity type opposite to that of the base region is formed in the base region. The well comprising the collector region is the driven node and the emitter, to which one plate of a capacitor is connected, forms the isolated node. The other plate of the capacitor is connected to a fixed voltage potential such as ground.

BRIEF DESCRIPTION OF THE DRAWINGS

FIG. 2b is a graph of voltage versus current for the expansive adaptive element of FIG. 2a.

FIG. 3b is a graph of voltage versus current for the compressive adaptive element of FIG. 3a.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
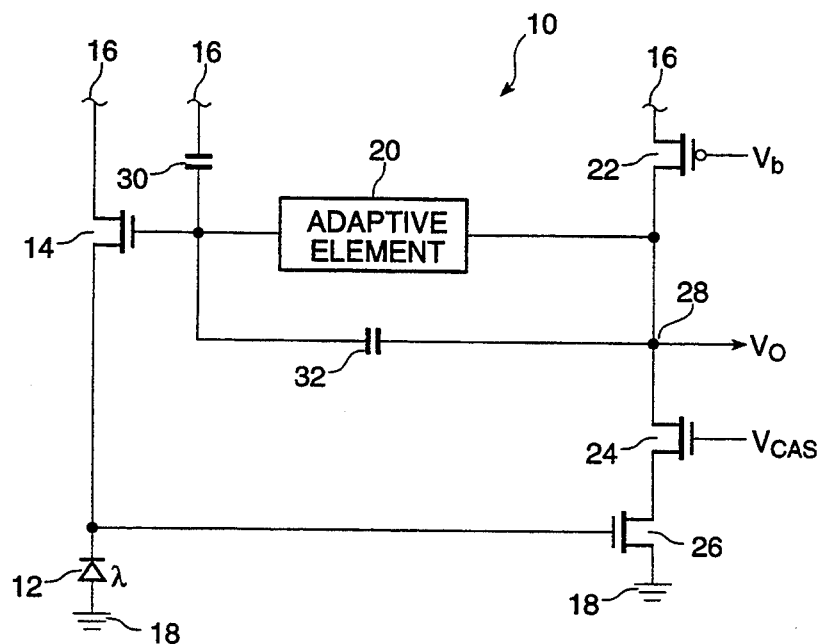
FIG. 1 is a schematic diagram of an adaptive photoreceptor semiconductor circuit for long-time-constant continuous learning having low offset and insensitivity to light according to a presently preferred embodiment of the invention.

Referring first to FIG. 1, a schematic diagram of an adaptive photoreceptor semiconductor circuit 10 according to the present invention is shown. The adaptive photoreceptor semiconductor circuit 10 of the present invention is useful for long-time-constant, continuous learning and is characterized by low offset and insensitivity to light.

Adaptive photoreceptor circuit 10 of the present invention includes a photodiode 12 in series with an N-channel feedback transistor 14 having its drain connected to a source of a first potential 16 and its source connected to the n-region of photodiode 12. The p-region of photodiode 12 is connected to a source of a second potential 18, shown as ground potential in FIG. 1. A typical potential difference between the first and second potentials is 5 volts, but those of ordinary skill in the art will realize that the potential difference could be from about 1 to 6 volts, The gate of N-channel feedback transistor 14 is connected to a first node of adaptive element 20. As will be disclosed herein, adaptive element 20 is insensitive to light and is therefore unlike prior art adaptive elements. A second node of adaptive element 20 is connected to the drain of P-Channel MOS transistor 22. The source of P-Channel MOS transistor 22 is connected to source of first potential 16 and its gate is connected to bias voltage source Vb. The drain of P-Channel MOS transistor 22 is connected to the drain of N-Channel MOS cascode transistor 24. The source of N-Channel MOS cascode transistor 24 is connected to the drain of N-Channel MOS transistor 26 and the gate of N-Channel MOS cascode transistor 24 is connected to a voltage source Vcas. The source of N-Channel MOS transistor 26 is connected to source of second potential 18 and its gate is connected to the common connection of the n-region of photodiode 12 and source of N-channel feedback transistor 14. The common drain connection of MOS transistors 22 and 24 forms the output node 28 of adaptive photoreceptor circuit 10. MOS transistors 22 and 26 comprise an inverting amplifier and N-Channel MOS cascode transistor 24 isolates the drain of N-Channel MOS transistor 26 from large voltage swings at output node 28. Those of ordinary skill in the art will recognize that cascode transistor 24 may be omitted, if desired.

A first capacitor 30 is connected between source of first potential 16 and the first node of adaptive element 20 and a second capacitor 32 is connected between the first node of adaptive element 20 and output node 28. Those of ordinary skill in the art will recognize that, if maximum gain is required, the second capacitor 32 may be eliminated.

Light shining on adaptive photoreceptor circuit 10 generates a photocurrent in photodiode 12 which is linearly proportional to the intensity of the light. The rest of the circuit of adaptive photoreceptor circuit 10 senses the photocurrent with high sensitivity and adjusts the operating point of the circuit around the historical average value of the light intensity. The DC gain of the circuit is low and the transient gain is high. The capacitive divider formed by capacitors 30 and 32 determines the transient gain of the amplifier. Adaptive element 20 is a resistor-like device and allows the receptor to respond over a large dynamic range, by storing a voltage related to the average light intensity on capacitor 30.

The operation of the adaptive photoreceptor circuit 10 may be understood in greater detail by analyzing the input photocurrent from the photodiode 10 as consisting of a steady-state background component Ibg, and a varying, or transient, component i. The goal of the computation performed by adaptive photoreceptor circuit 10 is to compute the ratio of i/Ibg. This ratio is the important quantity to measure for vision, because it corresponds to scene reflectivity rather than luminance.

The adaptive photoreceptor circuit 10 of the present invention may be fabricated using conventional CMOS technology. As presently preferred, the photodiode 12 is simply an extension of the source of N-Channel MOS transistor 14. All parts of the circuit except for photodiode 12 are covered with metal.

The model of the average intensity is stored as a charge on capacitor 30, and N-Channel MOS feedback transistor 14 supplies the model photocurrent. The voltage on the source of N-Channel MOS feedback transistor 14 is determined by the voltage at the gate of N-

Channel MOS feedback transistor 14 and by the photocurrent Ibg+i. Indirectly, the feedback clamps the source voltage of N-Channel MOS feedback transistor 14 at whatever voltage it takes for N-Channel MOS transistor 26 to sink the bias current supplied by P-Channel MOS transistor 22. For typical intensities, N-Channel MOS feedback transistor 14 operates in its subthreshold region, The source voltage of N-Channel MOS feedback transistor 14 sits below its gate voltage at whatever voltage it takes to turn on N-Channel MOS feedback transistor 14 to supply the photocurrent. Because the current Ibg+i is exponential in the source voltage and in the gate voltage, the adaptive photoreceptor circuit 10 of the present invention is immediately and naturally a logarithmic detector.

A comparison between the input intensity and the model of intensity is performed by the inverting amplifier consisting of MOS transistors 22 and 26. The additional N-Channel MOS cascode transistor 24, in a cascode configuration, isolates the drain of N-Channel MOS transistor 26 from the large output voltage swings at output node 28. The input voltage at the gate of N-Channel MOS transistor 26 controls the current drawn from the output node 28 by N-Channel MOS transistor 26. The current pushed into the output node 28 by P-Channel MOS transistor 22 is fixed by the bias voltage Vb.

The voltage gain (-A) of the amplifier is determined by the ratio of the transconductance of N-Channel MOS transistor 26 to the parallel combination of the drain conductances of P-Channel MOS transistor 22 and the series combination of N-Channel MOS transistors 24 and 26, and is typically several hundred. The bias voltage, Vb, determines the cutoff frequency for the receptor, by setting the bias current in the inverting amplifier. This control may be employed to filter out flicker from artificial lighting.

The N-Channel MOS cascode transistor 24 is a source follower which shields the drain of N-Channel MOS transistor 26 from the large voltage swings at output node 28. The voltage Vcas is held high enough to hold the source of N-Channel MOS cascode transistor 24 high enough to saturate the drain of N-Channel MOS transistor 26, but not so high that the source of N-Channel MOS cascode transistor 24 is above the voltage which would exist at output node 28 if N-Channel MOS cascode transistor 24 was omitted from the circuit. The purpose of N-Channel MOS cascode transistor 24 is to nullify the large voltage swings across the gate-to-drain capacitance of N-Channel MOS transistor 26 that load down the input node. These voltage swings can make femtofarad-scale gate-to-drain capacitances appear to the input node to be on the picofarad scale, greatly slowing the time response of the circuit.

In addition, the cascode effect of N-Channel MOS cascode transistor 24 multiplies the drain resistance of N-Channel MOS transistor 26 by a factor of approximately A, and hence, increases the gain of the amplifier by a factor of 2 or more. Both the reduction in effective input capacitance, and the increased gain, translate into speedup, and hence, increased dynamic range. The addition of this single cascode transistor increases the dynamic range of the receptor by about a decade of absolute intensity, as will be seen herein.

The output voltage Vo at output node 28 is fed back to the gate of N-Channel feedback transistor 14 through the adaptive element 20 and through the capacitive divider formed from capacitors 30 and 32. On long time scales, the feedback is a short circuit, because charge flows through the resistor-like adaptive element 20 and onto the gate of N-Channel MOS feedback transistor 14 until the voltage across the adaptive element 20 is near zero. On short time scales, no charge flows through the adaptive element 20, but changes in Vo are directly coupled to changes in voltage at the gate of N-Channel MOS feedback transistor 14 through the capacitive divider.

The effect of a small intensity change may be followed around the loop. A small-signal representation is denoted by lowercase. In response to a change of light intensity represented by a current i, the output voltage $v_o$ moves enough so that the voltage at the gate of N-Channel MOS feedback transistor 14 moves enough so that the voltage at the gate of N-Channel MOS transistor 26 is held nearly constant. The voltage at the gate of N-Channel MOS transistor 26 is clamped because A is large. Only a tiny change in the voltage at the gate of N-Channel MOS transistor 26 is needed to move $v_o$ to wherever it needs to be to change the voltage at the gate of N-Channel MOS feedback transistor 14 to supply the current i.

In response to a change in current i, the voltage at the gate of N-Channel MOS feedback transistor 14 must move by some amount to hold the voltage at the gate of N-Channel MOS transistor 26 clamped. On long time scales, the gain of the receptor is low, because the feedback is a short circuit across the adaptive element 20, and vo need not move much to hold the voltage at the gate of N-Channel MOS transistor 26 clamped. For short time scales and small input signals, no charge flows through the adaptive element 20.

When $v_o$ moves a lot, the voltage on the gate of N-Channel MOS transistor 14 only moves a little, because the feedback capacitor 32 is smaller than the storage capacitor 30. The larger the capacitive divider ratio, the more Vo must move to move the voltage on the gate of N-Channel MOS transistor 14 by the required amount. The gain of the adaptive photoreceptor circuit 10 is set by the capacitive-divider ratio. The larger capacitor 30 is relative to capacitor 32, the larger the gain of the circuit.

It is simple to compute the steady-state and transient gain of the receptor from the arguments just given; the key assumption is that A is large so that the voltage on the gate of N-Channel MOS transistor 26 is held clamped. The gain from the voltage on the gate of N-Channel MOS transistor 14 to the voltage on the gate of N-Channel MOS transistor 26 is just $\kappa$, the back-gate coefficient. The gain from Vo to the voltage on the gate of N-Channel MOS transistor 14 is 1 in the steady-state condition, and is C32/(C30+C32) transiently, when no charge flows through the adaptive element 20. The gain from input current i to the voltage on the gate of N-Channel MOS transistor 26 is just -Vt per e-fold intensity change. The complete closed-loop gain for both steady-state and transient inputs is obtained by computing the $v_o$ needed to hold the input voltage clamped. Hence, the linearized steady-state closed-loop gain is:

$$(v_o/Vt)/(i/Ibg) = \kappa \qquad [1]$$

and the linearized transient closed-loop gain is:

$$(v_o/Vt)/(i/Ibg) = (1/\kappa)\,((C30+C32)/C32) \qquad [2]$$

The gain is written in dimensionless form, to display in a simple way the logarithmic, contrast-sensitive response properties. Equation [1] is the small-signal equivalent of the large signal expression for the steady-state output voltage:

$$(v_o/Vi) = \log I_b/I_o + 1/\kappa \log ((I_{bg}+i)/I_o) \quad [3]$$

where $I_b$ is the amplifier bias current and $I_o$ is the preexponential in the subthreshold transistor law. The ratio between transient and steady-state gain is simply the capacitive divider ratio (C30+C32)/C32. An important parameter of this system is the total loop gain, obtained by following the gain all the way around the loop. The total loop gain is:

$$A_{Loop} = A \kappa C32/(C30+C32) \quad [4]$$

Adaptation occurs when charge is transferred onto or off the storage capacitor 30. This charge transfer occurs through the adaptive element. The adaptive element is a resistor-like device which has a monotonic I-V relationship. In VLSI, however, true resistors are much too low in value for adaptation on the time scale of seconds, so transistors are used in the adaptive element.

Figure 2A:
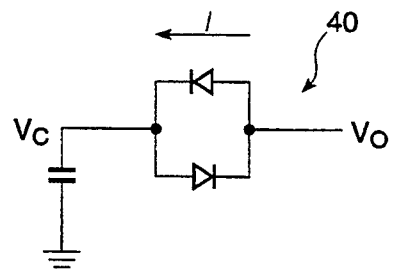
FIG. 2a is an idealized equivalent circuit for an expansive adaptive element according to the present invention.
Figure 2B:
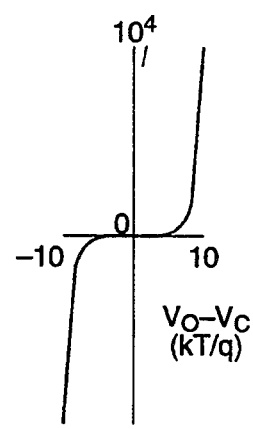

Referring now to FIGS. 2a, 2b, 3a, and 3b, two novel adaptive elements have been developed with dual nonlinearities. One is expansive and one is compressive. The expansive adaptive element 40 is shown in FIG. 2a, and acts functionally like a pair of diodes connected in parallel, one having its polarity reversed with respect to the other. As shown in the graph of FIG. 2b, the current through the expansive adaptive element increases exponentially with voltage for either sign of voltage. In addition, there is an extremely high-resistance region around the origin of the graph.

The I-V relationship of the expansive adaptive element 40 of FIG. 2a means that the effective resistance of the element is huge for small signals, and small for large signals. Hence, the adaptation is slow for small signals and fast for large signals. This behavior is useful, since it means that the receptor can quickly adapt to a large change in conditions, say, moving from shadow into sunlight, while maintaining high sensitivity and long time constant for small signals.

Figure 3A:
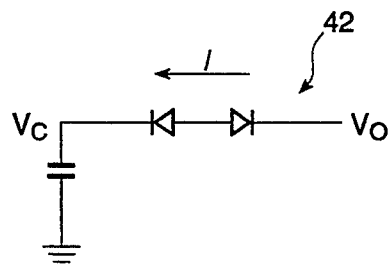
FIG. 3a is an idealized equivalent circuit for an compressive adaptive element according to the present invention.
Figure 3B:
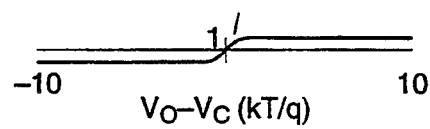

Referring now to FIG. 3a, the compressive adaptive element 42 acts functionally like a pair of back-to-back diodes in series. As shown by the graph of FIG. 3b, the current saturates at a very small value for either sign of voltage, with a small linear central region.

The I-V relationship of the compressive adaptive element 42 of FIG. 3a means that the effective resistance is constant for small voltages, and becomes huge for large voltages. For large voltages, the element simply acts like a current source and not a resistor. The effect is that large changes in intensity are effectively ignored on short time scales. The receptor is equally sensitive to both large and small intensity changes. The adaptation time is proportional to the size of the signal.

An obvious advantage of using active feedback in the adaptive receptor of the present invention is that the separate bias current in the output leg of the receptor is capable of driving arbitrarily-large capacitive loads, simply by adjusting the bias current. More fundamentally, however, the feedback configuration, by clamping the gate voltage of the N-Channel MOS transistor 26, extends the usable dynamic range of the receptor by speeding it up. The small photocurrents need only charge and discharge the small changes in the gate voltage of the N-Channel MOS transistor 26, rather than the large swings of Vo. It can immediately be deduced that the larger the gain A of the amplifier, the more speedup is obtained. Also, for a given amplifier, the more closed-loop gain which is designed into the receptor, by adjusting the capacitive divider ratio, the slower the response becomes. The speed of the input node if the voltage on the gate of N-Channel MOS feedback transistor 14 is held constant, say, by breaking the loop there, may be taken as a baseline. The speedup, over this baseline value, that may be obtained by using the active feedback is proportional to the total loop gain $A_{Loop}$. A typical measured speedup, using the active feedback and the cascode, is 1-2 decades.

Figure 4:
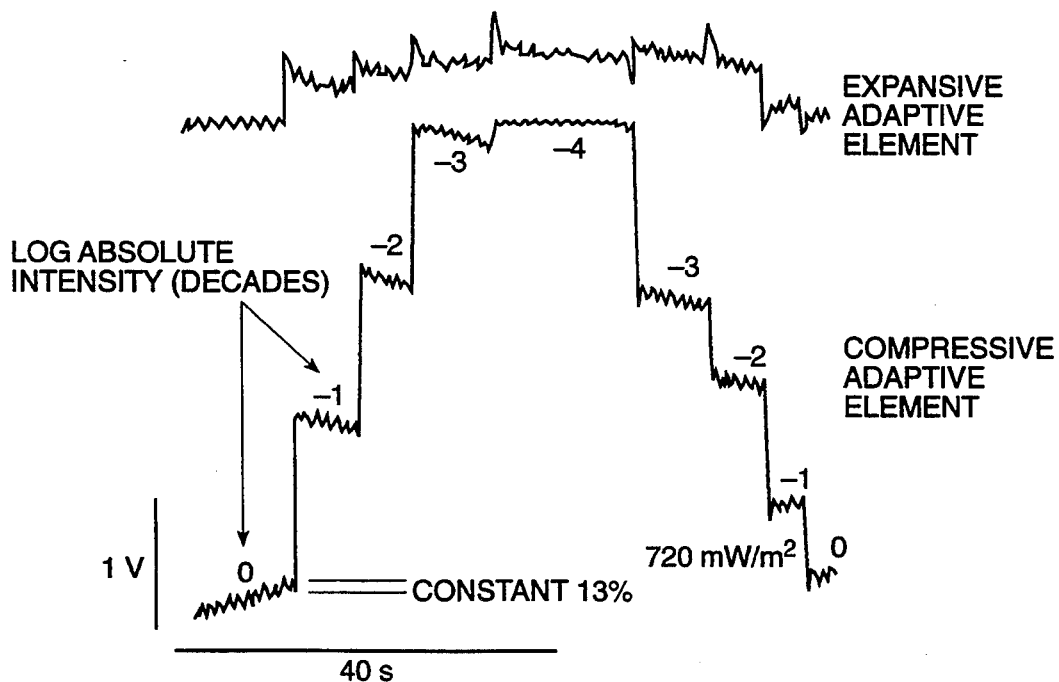
FIG. 4 is a graph showing the response of the circuit of FIG. 1 using expansive and compressive adaptive elements of the present invention.

Referring now to FIG. 4, the behavior of the adaptive receptor of the present invention with both the expansive and compressive adaptive elements may be understood by examining the measured response to an input of varying intensity. The incident intensity is a small oscillatory intensity variation superimposed on a steady background. The contrast of the signal, relative to the background, is a fixed percentage (in this case 13%), independent of the absolute intensity. The overall intensity level is varied by interposing neutral density filters (like sunglasses) with various attenuation factors. All the behaviors discussed herein appear in FIG. 4. Because the response of the adaptive receptor of the present invention is logarithmic, the amplitude of the response to the small contrast variation is almost invariant to the absolute intensity.

The receptor that uses the expansive adaptive element adapts very rapidly in response to the large change in intensity caused by a filter change. Because the steady-state gain is much smaller than the transient gain, the adapted response to an intensity change of a decade is almost the same as the response to the 13% variation. The time constant of the adaptation is much shorter than the period of the input signal. It thus may be seen how the receptor of the present invention could be useful in systems in which contrast changes in the image, and not the absolute intensities, are important. In contrast, the receptor that uses the compressive element adapts very slowly to the large intensity changes, but also faithfully reports their size.

The key difficulty in the practical use of adaptive elements in vision circuits, where light falls on the surrounding circuitry, is related to the effect of light on silicon. Light creates minority carriers, and minority carriers diffuse home to their majority regions, creating junction currents. Because the diffusion length is tens of microns, it is not practical to build guard structures to soak up the excess carriers. The adaptive elements, constructed from transistors, are at the same time photodiodes. In the adaptive photoreceptor circuit of the present invention, the adaptive element is connected so that only one side is driven. The leakage currents pull the undriven side to the wrong voltage, and unbalance the operating point of the element to one side. Circuits constructed from naively-designed adaptive elements are unbalanced both in steady-state and in response to both up-going and down-going changes.

The two adaptive elements of the present invention are inherently resistant to these junction leakage effects. Both elements use the idea that the undriven node is isolated from any reference voltage other than the driven side. Before we describe the new adaptive elements, previous solutions and the reasons why they are not satisfactory will be discussed.

Typical examples of known adaptive elements are presented in FIG. 10.11 at page 174 of the Book Analog VLSI and Neural Systems, By Carver A. Mead, Addison-Wesley Pub. Co. 1989. The expansive adaptive elements shown therein each consist of complementary diode-characteristic elements that turn on for opposite polarities of voltage, and each has an I-V relationship, in the first order, like/=sinh (V). The problem with each of these elements is that junction leakage currents cause a large offset voltage and asymmetric operation.

For example, consider the element labeled (c) consisting of two native diode-connected transistors. The source-drains of the two diode-connected transistors sit on the bulk substrate. These source-drains are also photodiodes that soak up stray minority careers generated, say, by light falling on the nearby opening in the metal. Any charge sitting on the source-drain is leaked away towards the bulk potential, which is ground. In order to hold the capacitor at the correct voltage to complete the feedback loop, the output of the photoreceptor must turn on the element to counteract the leakage. The large source voltage combines with the back-gate effect to produce an steady-state offset voltage $V_c - V_o$, across the adaptive element, of at least 1V, even in the dark.

An attempt to avoid this problem is shown in the adaptive element labeled (a). The idea is that the transistors are protected from stray minority careers that are generated in the bulk substrate, because these carriers are absorbed by the well, where they are lost in the sea of majority carriers. Empirically, however, the minority carriers generated in the well by scattered light are sufficient to unbalance the circuit, resulting in an offset voltage that is as large as in the element of (c), and a very unsymmetrical response to bright and dark edges when incorporated in an adaptive receptor, Even in the dark, junction leakage currents, combined with the large back-gate effect, leave a remnant offset of about a volt.

It might also be thought that a combination of native and well transistors would cancel the leakage currents (elements (b) and (d) of FIG. 10.11 ). This balancing act fails, because the substrate leakage dominates the well leakage by orders of magnitude.

Figure 5A:
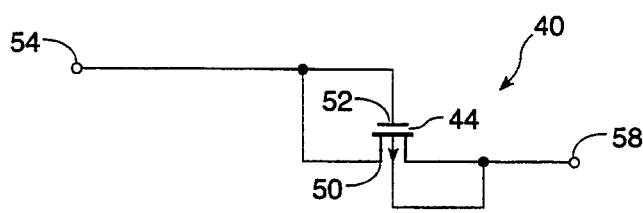
FIGS. 5a and 5b, are respectively, a schematic diagram and a cross sectional diagram of a presently preferred implementation of an expansive adaptive element according to the present invention.
Figure 5B:
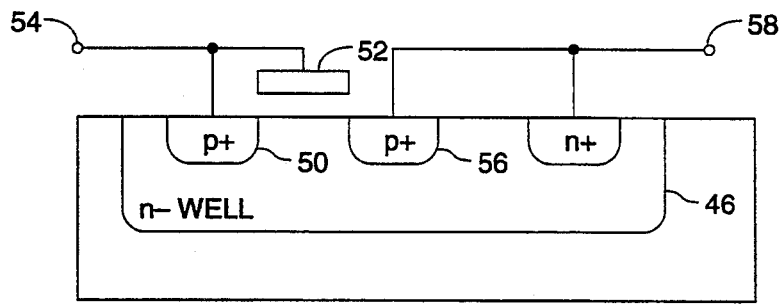

Referring now to FIGS. 5a and 5b, a schematic diagram and a cross sectional diagram of a presently preferred implementation of an expansive adaptive element according to the present invention are shown, respectively. The expansive adaptive element 40 of the present invention is inherently insensitive to the effect of junction leakage currents. Expansive adaptive element 40 consists of a single well transistor 44 sitting in its own isolated well 46. One source-drain 50 of the transistor 44, and the gate 52 of transistor 44 are attached together to form the isolated node 54. The other source-drain 56, and the well 44 itself (via n+diffusion 58) are attached together to form the driven node 58, which is connected to amplifier output node 28 (FIG. 1).

The operation of the expansive adaptive element 40 depends on the direction in which the current flows. When the output voltage at output node 28 is higher than the voltage on capacitor 30 (FIG. 1), the current is conducted by the surface-channel field-effect transistor formed between source-drains 50 and 56. The source 56 of the transistor is raised above the gate 52 and drain 50, and the current flows through the surface channel. The effect of raising the voltage on the source 56 and the well 46 together is effectively the same as lowering the voltage on the gate 52, because there is no other reference voltage that matters. Hence the current e-folds every kT/qκ volts.

When the output voltage at node 28 is lower than the voltage on capacitor 30, the current is conducted by a bipolar bulk mechanism. The junction between the well 46 and the source-drain diffusion 50 attached to the capacitor 30 is forward-biased. Much of the charge emitted from the capacitor source-drain diffusion is collected by the bulk substrate 46 and not by the other source-drain diffusion 56. In other words, the bipolar current gain means that it takes only a little current sunk by the output node 28 to forward bias the junction. The current e-folds every kT/q volts.

The low offset functioning of: expansive adaptive element 40 lies in two details. First, the capacitor 30 has no reference voltage other than the receptor output voltage. There is no power supply rail to leak to. The only available reference voltage is the voltage of the well 46, which is connected to the output voltage of the receptor on output node 28. Second, the transistor bulk (i.e., the well 46) is at the source voltage, so there is no back-gate effect and the off-state conductance in the field-effect surface-channel transistor is large enough to overcome the junction potential between capacitor 30 and well 46 that is induced by scattered light. In other words, if there were no field-effect transistor, a junction potential between well 46 and capacitor 30 would form to cancel the remnant junction current caused by thermally or optically generated carriers. The field-effect transistor leaks enough so that this junction potential is negligibly small.

Figure 5C:
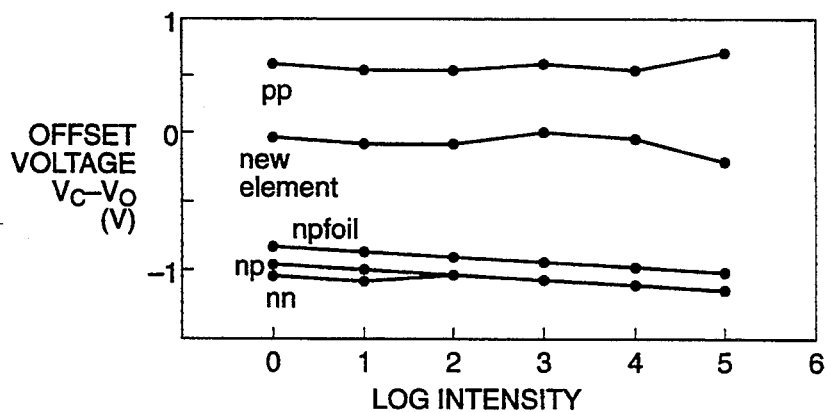
FIG. 5c is a graph comparing the measured static DC offset voltage in the prior-art adaptive elements and in the circuit of FIG. 1 using the expansive adaptive element of FIGS. 5a and 5b.

FIG. 5c is a graph comparing the measured static DC offset voltage in the circuit of FIG. 1 using prior-art adaptive elements and in the circuit of FIG. 1 using expansive adaptive element 40 of FIGS. 5a and 5b. It may be seen from these measurements that the offsets are minimal in expansive adaptive element 40 compared with the prior-art adaptive elements.

Figure 5D:
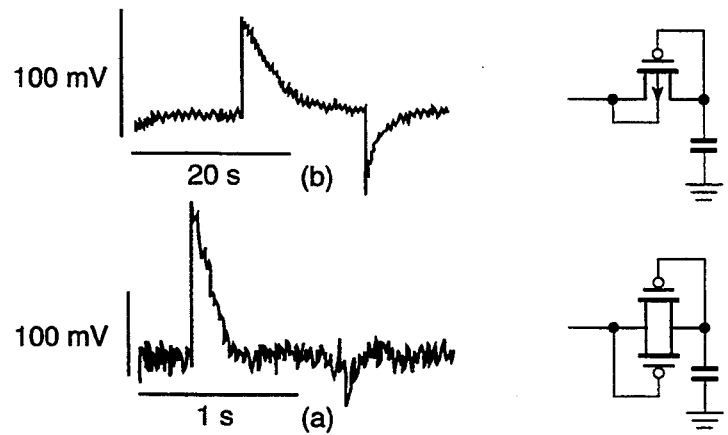
FIG. 5d is a graph comparing the response to step changes in the intensity of a photoreceptor built using a prior-art element and the circuit of FIG. 1 using the expansive adaptive element of the present invention.

FIG. 5d compares the response to step changes in the intensity of a photoreceptor built using the prior-art element (a) in the Mead reference, and expansive adaptive element 40 of the present invention. The prior-art receptor (a) responds very unsymmetrically to increases and decreases of intensity, because the adaptive element sits on one side of the I-V profile. The asymmetry is worse under bright light (not shown), indicating the role of light-generated carriers. In contrast, the receptor using expansive adaptive element 40 responds much more symmetrically (b) to the same step changes of intensity. The response is still asymmetric, but the asymmetry is explained by the difference between the bipolar and FET conduction modes in the two directions. In the light-to-dark direction, the current through the expansive element e-folds every kT/q, in the dark-to-light direction, every kT/qκ. The expansive adaptive element 40 should adapt somewhat more quickly in response to transitions from light to dark, and it may be seen from FIG. 5d that it does.

An example of a prior-art compressive adaptive element is described in M. A. Mahowald, "Silicon Retina with Adaptive Photoreceptors," Proc. SPIE/SPSE Symposium on Electronic Science and Technology: from Neurons to Chips, vol. 1473, pp. 52–58, April 1991. The problem with this element is similar to the problems of the prior-art expansive adaptive elements discussed previously. There is a diode leakage current from the well to the bulk substrate that is exacerbated by light-generated minority carriers. This leakage causes a large offset in a feedback circuit, and makes the response of the feedback circuit asymmetrical in response to increases and decreases in the input. In other words, in one direction of change, adaptation is rapid, and in the other it is slow.

Figure 6A:
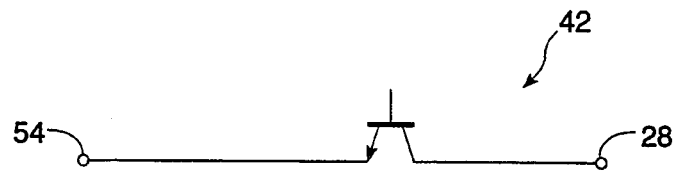
FIGS. 6a and 6b, are respectively, a schematic diagram and a cross sectional diagram of a presently preferred implementation of a compressive adaptive element according to the present invention.
Figure 6B:
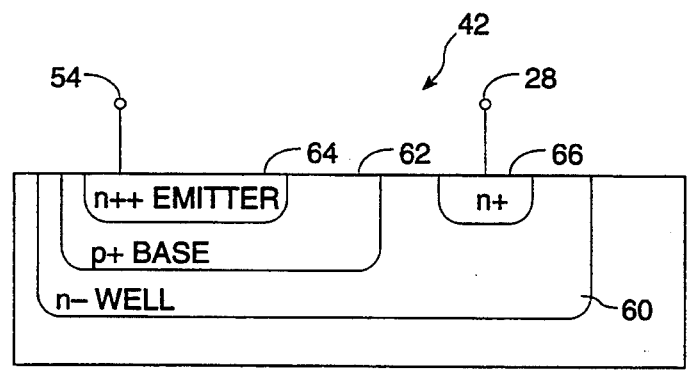
Figure 6C:
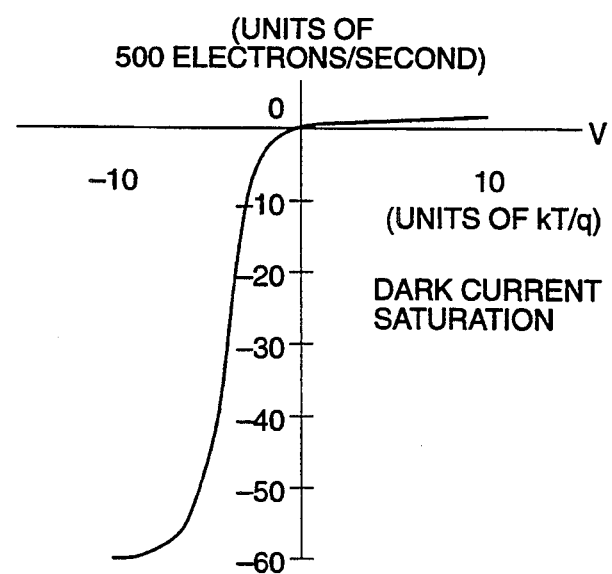
FIG. 6c is a graph illustrating the response of a receptor built using compressive element of FIGS. 6a and 6b.

FIGS. 6a and 6b, are respectively, a schematic diagram and a cross sectional diagram of a presently preferred implementation of a compressive adaptive element 42 according to the present invention. Compressive adaptive element 42 employs a vertical bipolar transistor structure available in a BiCMOS process to construct an isolated node 54. N-well 60 forms the collector of a vertical NPN transistor, while p+region 62 forms its base, and n++region 64 forms its emitter. Collector 60 is connected to the output node 28 of the amplifier by n+contact region 66. Capacitor 30 (FIG. 1) is connected between the positive voltage rail and emitter 64. Again the trick is that isolated node 54 can only leak to the driven voltage, leading to small offset. The difference in the doping profiles between the two junctions in the bipolar device leads to a saturation current that is about 60 times higher in one direction than in the other. The response of a receptor built using compressive element 42 is shown in FIG. 6c. As can be seen from the time scale on FIG. 4, the effective time constant of the adaptation is adequate at even the highest intensities for vision tasks on the scale of seconds or faster, despite the difference in slew rate.

The details of the leakage effects in the compressive element are as follows. In the dark, the saturation current is 500 electrons/second onto capacitor 30, and 30,000 electrons/second off capacitor 30. With a capacitance of 0.5 pF (the capacitance of a 30 $\mu$m by 30 $\mu$m poly 1 to poly 2 capacitor), these currents translate to a downward slew rate of a thermal voltage (25 mV) every 3 minutes, and an upward slew rate of a thermal voltage every 3 seconds. This ratio of 60 in saturation current is explained by the different characteristics of the two junctions; the saturation current of the base-emitter junction is about 60 times smaller than the saturation current of the base-collector junction. This ratio of saturation currents is independent of intensity, although the absolute value is proportional to intensity. The leakage current of the base-emitter junction is smaller because the doping of the n++emitter and the p+base is larger than the doping of the n-well, leading to smaller minority concentrations, and hence, smaller reverse-saturation current.

While embodiments and applications of this invention have been shown and described, it would be apparent to those skilled in the art that many more modifications than mentioned above are possible without departing from the inventive concepts herein. For example, the illustrative embodiment shown herein uses n-well technology. Those of ordinary skill in the art will recognize that p-well technology could be used, and further that all n and p devices and power supply polarities could be reversed. The invention, therefore, is not to be restricted except in the spirit of the appended claims.

What is claimed is:

1. A low offset, light insensitive adaptive photoreceptor semiconductor circuit for long-time-constant continuous learning disposed in a semiconductor body, including:

a MOS feedback transistor of a first conductivity type having a first source-drain region connected to a source of a first voltage potential, a gate, and a second source-drain region;

a photodiode having a first terminal connected to said second source-drain region of said MOS feedback transistor and a second terminal connected to a source of a second voltage potential, said photodiode oriented so as to be reverse biased with respect to said sources of first and second voltage potential;

an inverting amplifier having an input connected to said first terminal of said photodiode and an output connected to an output node;

a light-insensitive adaptive element having a driven node connected to said output node and an isolated node connected to the gate of said MOS feedback transistor; and a first capacitor having a first plate connected to a source of fixed voltage potential and a second plate connected to said isolated node of said adaptive element.

2. The adaptive photoreceptor semiconductor circuit of claim 1 further including a second capacitor having a first plate connected to said isolated node of said adaptive element and a second plate connected to said output node.

3. The adaptive photoreceptor semiconductor circuit of claim 1 wherein said light-insensitive adaptive element comprises an expansive adaptive element.

4. The adaptive photoreceptor semiconductor circuit of claim 1 wherein said light-insensitive adaptive element comprises a compressive adaptive element.

5. The adaptive photoreceptor semiconductor circuit of claim 3, wherein said expansive adaptive element comprises:

an isolated well structure of a conductivity type opposite the conductivity type of said semiconductor body disposed in said semiconductor body;

a driven node;

an isolated node;

first and second spaced apart doped regions having conductivity type opposite to that of said well disposed in said well structure, said first doped region connected to said isolated node and said second doped region connected to the bulk of said well and to said driven node; and a gate disposed over and insulated from said first and second doped regions to form an MOS transistor, said gate connected to said first doped region.

6. The adaptive photoreceptor semiconductor circuit of claim 4, wherein said compressive adaptive element comprises:

a driven node;

an isolated node;

an isolated well structure comprising a collector region having a conductivity type opposite the conductivity type of said semiconductor body disposed in said semiconductor body, said well structure connected to said driven node;

a base region comprising a region of conductivity type opposite to that of said well structure disposed in said well; and an emitter region comprising a region having a conductivity type the same as that of said well disposed in said base region, said emitter region connected to said isolated node.

7. A low offset, light insensitive adaptive photoreceptor semiconductor circuit for long-time-constant continuous learning disposed in a semiconductor body, including:

a MOS feedback transistor of a first conductivity type having a first source-drain region connected to a source of a first voltage potential, a gate, and a second source-drain region;

a photodiode having a first terminal connected to said second source-drain region of said MOS feedback transistor and a second terminal connected to a source of a second voltage potential, said photodiode oriented so as to be reverse biased with respect to said sources of first and second voltage potential;

a MOS amplifier transistor of a second conductivity type opposite to said first conductivity type having a source-drain region connected to said source of first voltage potential, a gate connected to a source of bias voltage potential, and a second source-drain region connected to an output node;

a MOS amplifier transistor of said first conductivity type having a first source-drain region connected to said second source-drain region of said MOS amplifier transistor of a second conductivity type, a gate connected to the second source-drain region of said MOS feedback transistor, and a second source-drain region connected to said source of second voltage potential;

a light-insensitive adaptive element having a driven node connected to said output node and an isolated node connected to the gate of said MOS feedback transistor; and a first capacitor having a first plate connected to a source of fixed voltage potential and a second plate connected to said isolated node of said adaptive element.

8. The adaptive photoreceptor semiconductor circuit of claim 7 further including a second capacitor having a first plate connected to said isolated node of said adaptive element and a second plate connected to said output node.

9. The adaptive photoreceptor semiconductor circuit of claim 7 wherein said light-insensitive adaptive element comprises an expansive adaptive element.

10. The adaptive photoreceptor semiconductor circuit of claim 7 wherein said light-insensitive adaptive element comprises a compressive adaptive element.

11. The adaptive photoreceptor semiconductor circuit of claim 9, wherein said expansive adaptive element comprises:
- an isolated well structure of a conductivity type opposite the conductivity type of said semiconductor body disposed in said semiconductor body;
- a driven node;
- an isolated node;
- first and second spaced apart doped regions having conductivity type opposite to that of said well disposed in said well structure, said first doped region connected to said isolated node and said second doped region connected to the bulk of said well and to said driven node; and
- a gate disposed over and insulated from said first and second doped regions to form an MOS transistor, said gate connected to said first doped region.

12. The adaptive photoreceptor semiconductor circuit of claim 10, wherein said compressive adaptive element comprises:
- a driven node;
- an isolated node;
- an isolated well structure comprising a collector region having a conductivity type opposite the conductivity type of said semiconductor body disposed in said semiconductor body, said well structure connected to said driven node;
- a base region comprising a region of conductivity type opposite to that of said well structure disposed in said well; and
- an emitter region comprising a region having a conductivity type the same as that of said well disposed in said base region, said emitter region connected to said isolated node.

13. A low offset, light insensitive adaptive photoreceptor semiconductor circuit for long-time-constant continuous learning disposed in a semiconductor body, including:
a MOS feedback transistor of a first conductivity type having a first source-drain region connected to a source of a first voltage potential, a gate, and a second source-drain region;

a photodiode having a first terminal connected to said second source-drain region of said MOS feedback transistor and a second terminal connected to a source of a second voltage potential, said photodiode oriented so as to be reverse biased with respect to said sources of first and second voltage potential;

a MOS amplifier transistor of a second conductivity type opposite to said first conductivity type having a source-drain region connected to said source of first voltage potential, a gate connected to a source of bias voltage potential, and a second source-drain region connected to an output node;

a MOS cascode transistor of said first conductivity type having a first source-drain region connected to said output node and to said second source-drain region of said MOS amplifier transistor of said second conductivity type, a gate connected to a source of cascode voltage potential and a second source-drain region;

a MOS amplifier transistor of said first conductivity type having a first source-drain region connected to said second source-drain region of said MOS cascode transistor, a gate connected to the second source-drain region of said MOS feedback transistor, and a second source-drain region connected to said source of second voltage potential;

a light-insensitive adaptive element having a driven node connected to said output node and an isolated node connected to the gate of said MOS feedback transistor; and a first capacitor having a first plate connected to a source of fixed voltage potential and a second plate connected to said isolated node of said adaptive element.

14. The adaptive photoreceptor semiconductor circuit of claim 13 further including a second capacitor having a first plate connected to said isolated node of said adaptive element and a second plate connected to said output node.

15. The adaptive photoreceptor semiconductor circuit of claim 13 wherein said light-insensitive adaptive element comprises an expansive adaptive element.

16. The adaptive photoreceptor semiconductor circuit of claim 13 wherein said light-insensitive adaptive element comprises a compressive adaptive element.

17. The adaptive photoreceptor semiconductor circuit of claim 15, wherein said expansive adaptive element comprises:
- an isolated well structure of a conductivity type opposite the conductivity type of said semiconductor body disposed in said semiconductor body;

a driven node;
an isolated node;
first and second spaced apart doped regions having conductivity type opposite to that of said well disposed in said well structure, said first doped region connected to said isolated node and said second doped region connected to the bulk of said well and to said driven node; and
a gate disposed over and insulated from said first and second doped regions to form an MOS transistor, said gate connected to said first doped region.

18. The adaptive photoreceptor semiconductor circuit of claim 16, wherein said compressive adaptive element comprises:
a driven node;
an isolated node;
an isolated well structure comprising a collector region having a conductivity type opposite the conductivity type of said semiconductor body disposed in said semiconductor body, said well structure connected to said driven node;
a base region comprising a region of conductivity type opposite to that of said well structure disposed in said well; and
an emitter region comprising a region having a conductivity type the same as that of said well disposed in said base region, said emitter region connected to said isolated node.

19. A low offset, light insensitive adaptive photoreceptor semiconductor circuit for long-time-constant continuous learning disposed in a semiconductor body, including:
an N-Channel MOS feedback transistor having a drain connected to a source of a first voltage potential, a gate, and a source;
a photodiode having a first terminal connected to said source of said MOS feedback transistor and a second terminal connected to a source of a second voltage potential, said photodiode oriented so as to be reverse biased with respect to said sources of first and second voltage potential;
an inverting amplifier having an input connected to said first terminal of said photodiode and an output connected to an output node;
a light-insensitive adaptive element having a driven node connected to said output node and an isolated node connected to the gate of said MOS feedback transistor; and
a first capacitor having a first plate connected to a source of fixed voltage potential and a second plate connected to said isolated node of said adaptive element.

20. The adaptive photoreceptor semiconductor circuit of claim 19 further including a second capacitor having a first plate connected to said isolated node of said adaptive element and a second plate connected to said output node.

21. The adaptive photoreceptor semiconductor circuit of claim 19 wherein said light-insensitive adaptive element comprises an expansive adaptive element.

22. The adaptive photoreceptor semiconductor circuit of claim 19 wherein said light-insensitive adaptive element comprises a compressive adaptive element.

23. The adaptive photoreceptor semiconductor circuit of claim 21, wherein said expansive adaptive element comprises:
an isolated n-well structure disposed in said semiconductor body;

a driven node;
an isolated node;
first and second spaced apart p-type doped regions disposed in said n-well structure, said first p-type region connected to said isolated node and said second p-type region connected to the bulk of said well and to said driven node; and
a gate disposed over and insulated from said first and second p-type regions to form an MOS transistor, said gate connected to said first p-type doped region.

24. The adaptive photoreceptor semiconductor circuit of claim 22, wherein said compressive adaptive element comprises:
a driven node;
an isolated node;
an isolated n-well structure comprising a collector region, said n-well structure connected to said driven node;
a p-type base region disposed in said n-well; and
an n-type emitter region disposed in said base region, said emitter region connected to said isolated node.

25. A low offset, light insensitive adaptive photoreceptor semiconductor circuit for long-time-constant continuous learning disposed in a p-type semiconductor body, including:
an N-Channel MOS feedback transistor having a drain connected to a source of a first voltage potential, a gate, and a source;
a photodiode having a cathode connected to said source of said N-Channel MOS feedback transistor and an anode connected to a source of a second voltage potential;
a P-Channel MOS amplifier transistor having a source connected to said source of a first voltage potential, a gate connected to a source of bias voltage potential, and a drain connected to an output node;
an N-Channel MOS amplifier transistor having a drain region connected to said drain of said P-Channel MOS amplifier transistor, a gate connected to the source of said N-Channel MOS feedback transistor, and a source connected to said source of second voltage potential;
a light-insensitive adaptive element having a driven node connected to said output node and an isolated node connected to the gate of said N-Channel MOS feedback transistor; and
a first capacitor having a first plate connected to a source of fixed voltage potential and a second plate connected to said isolated node of said adaptive element.

26. The adaptive photoreceptor semiconductor circuit of claim 25 further including a second capacitor having a first plate connected to said isolated node of said adaptive element and a second plate connected to said output node.

27. The adaptive photoreceptor semiconductor circuit of claim 25 wherein said light-insensitive adaptive element comprises an expansive adaptive element.

28. The adaptive photoreceptor semiconductor circuit of claim 25 wherein said light-insensitive adaptive element comprises a compressive adaptive element.

29. The adaptive photoreceptor semiconductor circuit of claim 27, wherein said expansive adaptive element comprises:
an isolated n-well structure disposed in said semiconductor body;

a driven node;
an isolated node;
first and second spaced apart p-type doped regions disposed in said n-well structure, said first doped region connected to said isolated node and said second doped region connected to the bulk of said n-well and to said driven node; and
a gate disposed over and insulated from said first and second doped regions to form an N-Channel MOS transistor, said gate connected to said first p-type doped region.

30. The adaptive photoreceptor semiconductor circuit of claim 28, wherein said compressive adaptive element comprises:
a driven node;
an isolated node;
an isolated n-well structure disposed in said semiconductor body comprising a collector region and connected to said driven node;
a base region comprising a p-type region disposed in said n-well; and
an emitter region comprising an n-type region disposed in said base region, said emitter region connected to said isolated node.

31. A low offset, light insensitive adaptive photoreceptor semiconductor circuit for long-time-constant continuous learning disposed in a p-type semiconductor body, including:
an N-Channel MOS feedback transistor having a drain connected to a source of a first voltage potential, a gate, and a source;
a photodiode having a cathode connected to said source of said N-Channel MOS feedback transistor and an anode connected to a source of a second voltage potential;
a P-Channel MOS amplifier transistor having a source connected to said source of a first voltage potential, a gate connected to a source of bias voltage potential, and a drain connected to an output node;
an N-Channel MOS cascode transistor having a drain connected to said output node and to said drain of said P-Channel MOS amplifier transistor, a gate connected to a source of cascode voltage potential and a source;
an N-Channel MOS amplifier transistor having a drain region connected to said source of said N-Channel MOS cascode transistor, a gate connected to the source of said MOS feedback transistor, and a source connected to said source of second voltage potential;
a light-insensitive adaptive element having a driven node connected to said output node and an isolated node connected to the gate of said N-Channel MOS feedback transistor; and
a first capacitor having a first plate connected to a source of fixed voltage potential and a second plate connected to said isolated node of said adaptive element.

32. The adaptive photoreceptor semiconductor circuit of claim 31 further including a second capacitor having a first plate connected to said isolated node of said adaptive element and a second plate connected to said output node.

33. The adaptive photoreceptor semiconductor circuit of claim 31 wherein said light-insensitive adaptive element comprises an expansive adaptive element.

34. The adaptive photoreceptor semiconductor circuit of claim 31 wherein said light-insensitive adaptive element comprises a compressive adaptive element.

35. The adaptive photoreceptor semiconductor circuit of claim 33, wherein said expansive adaptive element comprises:
an isolated n-well structure disposed in said semiconductor body;
a driven node;
an isolated node;
first and second spaced apart p-type doped regions disposed in said n-well structure, said first doped region connected to said isolated node and said second doped region connected to the bulk of said n-well and to said driven node; and
a gate disposed over and insulated from said first and second doped regions to form an N-Channel MOS transistor, said gate connected to said first p-type doped region.

36. The adaptive photoreceptor semiconductor circuit of claim 34, wherein said compressive adaptive element comprises:
a driven node;
an isolated node;
an isolated n-well structure disposed in said semiconductor body comprising a collector region and connected to said driven node;
a base region comprising a p-type region disposed in said n-well; and
an emitter region comprising an n-type region disposed in said base region, said emitter region connected to said isolated node.

37. An expansive adaptive element disposed in a semiconductor body comprising:
an isolated well structure of a conductivity type opposite the conductivity type of said semiconductor body disposed in said semiconductor body;
a driven node;
an isolated node;
first and second spaced apart doped regions having conductivity type opposite to that of said well disposed in said well structure, said first doped region connected to said isolated node and said second doped region connected to the bulk of said well and to said driven node; and
a gate disposed over and insulated from said first and second doped regions to form an MOS transistor, said gate connected to said first doped region.

38. A compressive adaptive element disposed in a semiconductor body comprising:
a driven node;
an isolated node;
a well structure comprising a collector region having a conductivity type opposite the conductivity type of said semiconductor body disposed in said semiconductor body, said well structure connected to said driven node;
a base region comprising a region of conductivity type opposite to that of said well structure disposed in said well;
an emitter region comprising a region having a conductivity type the same as that of said well disposed in said base region, said emitter region connected to said isolated node; and
a first capacitor having a first plate connected to a source of fixed voltage potential and a second plate connected to said emitter region,
wherein said isolated node is at a floating potential.

39. An expansive adaptive element disposed in a semiconductor body comprising:

an isolated n-well structure disposed in said semiconductor body;

a driven node;

an isolated node;

first and second spaced apart p-type doped regions disposed in said n-well structure, said first doped region connected to said isolated node and said second doped region connected to the bulk of said n-well and to said driven node; and a gate disposed over and insulated from said first and second doped regions to form an N-Channel MOS transistor, said gate connected to said first p-type doped region.

40. A compressive adaptive element disposed in a semiconductor body comprising:

a driven node;

an isolated node;

an n-well structure disposed in said semiconductor body comprising a collector region and connected to said driven node;

a base region comprising a p-type region disposed in said n-well;

an emitter region comprising an n-type region disposed in said base region, said emitter region connected to said isolated node; and a first capacitor having a first plate connected to a source of fixed voltage potential and a second plate connected to said emitter region, wherein said isolated node is at a floating potential.

* * * * *

UNITED STATES PATENT AND TRADEMARK OFFICE
CERTIFICATE OF CORRECTION

PATENT NO. : 5,376,813
DATED : December 27, 1994
INVENTOR(S) : Tobias Delbruck, Carver A. Mead It is certified that error appears in the above-indentified patent and that said Letters Patent is hereby corrected as shown below:

Column 6, line 62, replace "k" with --1/k--.

Column 9, line 10, replace "/" with --I--

Column 9, line 29, replace "careers" with --carriers--.

Column 10, line 16, after "of" delete ":".

Signed and Sealed this

Twenty-fifth Day of June, 1996

BRUCE LEHMAN

*Attest:*

*Attesting Officer*     *Commissioner of Patents and Trademarks*